United States Patent [19]
Hauser et al.

[11] Patent Number: 5,470,820
[45] Date of Patent: Nov. 28, 1995

[54] ELECTROPLATING OF SUPERCONDUCTOR ELEMENTS

[75] Inventors: Ray L. Hauser; Bolin Zheng, both of Boulder; Michael Renbarger, Littleton; Mark A. Lange, Golden, all of Colo.

[73] Assignee: Hauser Chemical Research, Inc., Boulder, Colo.

[21] Appl. No.: 120,172

[22] Filed: Sep. 10, 1993

Related U.S. Application Data

[63] Continuation-in-part of Ser. No. 892,227, Jun. 2, 1992, Pat. No. 5,244,875, which is a continuation-in-part of Ser. No. 695,942, May 6, 1991, abandoned.

[51] Int. Cl.$^6$ .............................. H01L 39/00; C25D 5/04
[52] U.S. Cl. .................. 505/472; 205/51; 205/152; 205/170; 205/224; 505/434
[58] Field of Search .................................... 505/472, 434; 205/51, 152, 170, 224

[56] References Cited

U.S. PATENT DOCUMENTS

| | | | |
|---|---|---|---|
| 4,870,051 | 9/1989 | Maxfield et al. | 205/125 |
| 4,914,081 | 4/1990 | Miller et al. | 205/51 |
| 4,939,119 | 7/1990 | Iwata et al. | 205/51 |
| 5,120,707 | 6/1992 | Maxfield et al. | 205/51 |

*Primary Examiner*—John Niebling
*Assistant Examiner*—Kishor Mayekar
*Attorney, Agent, or Firm*—Dean P. Edmundson

[57] ABSTRACT

Processes and techniques are described for concurrent electroplating of yttrium, barium and copper from aqueous solution onto a desired substrate (e.g., nickel, nichrome or silver). Compounds of these elements are dissolved in aqueous solution with a complexing agent meeting defined criteria and then are placed in a plating cell in which the cathode is the substrate on which the elements are to be deposited. After the elements have been deposited, they are oxidized to provide the desired perovskite structure. The process may be continuous or non-continuous.

24 Claims, 5 Drawing Sheets

A Example 10 at 295°K
B Example 10 at 77°K
C Silver ribbon at 77°K

ELECTROPLATING OF SUPERCONDUCTOR ELEMENTS

CROSS-REFERENCE TO RELATED APPLICATIONS

This application is a continuation-in-part of application Ser. No. 07/892,227, filed Jun. 2, 1992, now U.S. Pat. No. 5,244,875, which is a continuation-in-part of earlier application Ser. No. 07/695,942, filed May 6, 1991, now abandoned.

FIELD OF THE INVENTION

This invention relates to concurrent electroplating of multiple elements onto electrically conductive surfaces that are useful for making high temperature superconductors. This invention relates to batch and continuous processes for electro-deposition of superconductor elements.

BACKGROUND OF THE INVENTION

High temperature superconductors of the perovskite structure were originally produced from mixed oxides or oxide precursors. They have more recently been produced by very complex processes involving high vacuum, electron beams, and chemical vapor deposition. Most conductors prepared by such processes are limited to small or short dimensions, whereas electroplating is easily amenable to continuous production of long wires and ribbons.

The most common high temperature superconductive perovskite is $YBa_2Cu_3O_7$, wherein the three metallic elements present are of very different electrochemical characteristics. The molar ratio of oxygen present in this molecule is known to be slightly less than 7, but integers are used here for brevity. In relation to hydrogen, the electropotentials of these three metals are:

| | |
|---|---|
| Copper | +0.34 volt |
| Barium | −2.91 volts |
| Yttrium | −2.37 volts |

Where elements differ in electropotential as these metals do, they are extremely difficult to codeposit in a defined ratio. Where elements are highly electronegative in relation to hydrogen, as are barium and yttrium, they do not normally electroplate from an aqueous solution. Thus concurrent electroplating to make a deposit with elemental ratios 1:2:3 for $YBa_2Cu_3O_7$ is extremely difficult to accomplish. The ratio of deposition may be affected by the solution concentration, pH, the voltage difference between anode and cathode, temperature, current density, and presence of chemicals that might form complexes.

There has not heretofore been provided an efficient and effective process for concurrent electroplating of yttrium, barium and copper from aqueous solution. Whereas other electrodeposition processes have been researched and patented, the uniqueness of the present invention is evident in the discussion that follows.

The term electrodeposition covers placement of a material using an electromotive charge. When this is done from a liquid matrix, deposition can take place in one of two distinct processes:

1. Electroplating, wherein cations (+ charge) of a specific metal are attracted to the cathode (− electrode) and the ions are reduced to the elemental (metallic) state by addition of electrons to ions. The metal plating grows an atom at a time and generally forms a coherent metallic deposit.

2. Electrophoresis, wherein solid particles (not dissolved ions) are given an electrostatic charge (+ or −) and are attracted to an electrode of opposite charge, where the particles are physically agglomerated onto the substrate. Electrophoresis can be accomplished from colloids or dispersions and can sometimes be included with an electroplating process as noted below. Sometimes charged particles are deposited and agglomerated; sometimes charged colloids are deposited, as in latex electrodeposition; sometimes charged colloids containing mineral pigments are deposited, as in electrodeposition of automotive primers. See Sax & Lewis, Hawley's Condensed Chemical Dictionary, 11 ed, 1987, pp 457–458, Van Nostrand Reinhold Co, New York, incorporated herein by reference.

Electroplating can be accomplished from three different forms:

1. Single or mixed molten salt (e.g., aluminum manufacturing).

2. Aqueous solution (e.g., conventional copper, nickel and silver plating).

3. Nonaqueous solution (e.g., as described in U.S. Pat. No. 4,975,417).

Electroless or autocatalytic plating of metals is another form of deposition, but it is not electrodeposition and is distinct from the processes discussed herein.

The patents of Maxfield (U.S. Pat. No. 4,939,308) and Koura (U.S. Pat. No. 4,975,417) relate to concurrent electrodeposition of yttrium, barium, and copper. The Maxfield patent describes electroplating; the Koura patent describes electrophoretic deposition.

Barium, yttrium and copper have been concurrently electroplated from nonaqueous solution, as reported by Maxfield in U.S. Pat No. 4,939,308. Maxfield used nonaqueous solvent (dimethyl sulfoxide) because barium and yttrium can not normally be plated from aqueous solution. Maxfield specifically addressed this problem in column 2, lines 62–65 and column 3, lines 4–7. Maxfield allowed water content not exceeding that which would be coordinated with the dissolved ions (water of hydration), which is calculated to be 0.2% to 1.6% water for the examples given by Maxfield. By contrast, the process of the present invention involves electroplating in which water is the principal solvent.

Publications describing a process similar to that of Maxfield are: Bhattachary, et al, "YBaCuO Superconductor Thin Film via an Electrodeposition Process", J. Electrochem Soc vol 136, no. 6, June 1991, pp 1643–1645 and Minoura et al, "Preparation of $YBa_2Cu_3O_7$ and $Bi_2Sr_2CaCu_2O_7$ Films by Electrodeposition Techniques", Chemistry Letters, 1991, pp 379–382.

U.S. Pat. No. 4,975,417 (Koura) describes electrophoretic deposition of particulate barium carbonate from suspension onto a conductive substrate. This is not metallic electroplating as in the case of the Maxfield patent. The liquid media for this electrophoresis involves a mixture of organic solvents (e.g., isopropanol and acetone, methyl isobutyl ketone and ethyl ether) and the metal salts are not soluble in these solvents. Charging materials such as iodine and tetramethylammonium hydroxide are used, and electro-potentials range from 50 to 500 volts in order to form a good agglomeration of the deposited particles. Koura used mixtures of barium, yttrium and copper carbonates or oxides in the liquid medium and the deposit was in the form of mixed oxides.

Subsequently, those oxides were fused together to form a perovskite superconductor. The Koura patent is clearly stated to be an electrophoretic process and the immediate product is an agglomerate, distinctive from electro-plating. Distinctions of the Koura process include the high voltages and the use of dispersions rather than use of solutions.

Iwata et al (U.S. Pat. No. 4,939,119), describe superconductive elements which are electrodeposited from a dispersion or suspension onto a substrate. Iwata used separate powders of barium, yttrium and copper oxides or carbonates, suspended these in aqueous or preferably alcoholic liquid, and then deposited them using direct current voltages ranging from 30 to 300 volts. Iwata repeatedly described his process as being akin to that of "cation paint". Alternatively, Iwata reacted the three critical components to make a superconductive powder which was ground and then deposited onto the substrate electrophoretically. The Iwata process is limited to depositing layers of superconducting material that are thicker than the diameter of dispersed and agglomerated particles.

The process of the present invention is very distinct from both the Koura and Iwata patents in that the metals are deposited one ion/atom at a time from solution, and there is no limitation of minimum thickness per layer.

Further distinction of the present invention relates to the high current density that can be obtained with aqueous solutions, considerably higher than the 0.01 to 10 milliamperes/sq cm preferred by Maxfield. Higher current density of the present invention (ranging from about 15 to 70 mA/cm$^2$ or even higher) means that the electroplating can be accomplished more quickly and more economically.

Pawar and Pendse have published a paper "Electrodeposition by Dy-Ba-Cu Alloyed Films from Aqueous Bath," in Materials Research Bulletin, vol 26, 1991, pp 641–648, but they give little data on bath composition. They reported rapid decrease of current density within the first minute of plating which is an indication that the deposit is an electrical insulator, not a metallic layer as in the present invention. They report no complexing agent for this work and found that the thickness decreased after the first 20 minutes because of dissolution.

Minoura et al., supra, report on the codeposition of superconductive elements, with some similarities to Pawar. Minoura used a solvent mixture of dimethyl sulfoxide/water in ratio 10/1 by volume and nitrate salts of the desired metals. The low voltage (−1.4 to −2.0 volts) process deposited barium hydroxide and yttrium hydroxide rather than the metallic elements. As in the experiments of Pawar, the current dropped very quickly; this is due to the deposition of nonconducting hydroxides rather than deposition of metals. Minoura did not discuss use of any complexing agents to facilitate reduction of metallic ions to metals as in electroplating.

In contrast, the present invention deposits metallic elements or barium oxide surrounded by metallic elements (as shown in certain of the examples herein) and current remains relatively constant during the time of deposition. Following electroplating of the metallic elements, the process of this invention involves oxidation of these elements to form a perovskite structure.

The present invention involves the use of complexing agents to facilitate the electro-reduction of barium and yttrium ions to elements at the cathode. The use of complexes for these two metals has not been previously reported.

Complexing agents are used in the present invention for the purpose of improving the ionic reduction potentials of the desired metals, not for the purpose of chelation or increasing solubility in solution.

SUMMARY OF THE PRESENT INVENTION

In accordance with the present invention there is provided a process for concurrent electroplating of yttrium, barium, and copper onto a desired substrate from an aqueous solution containing a complexing agent.

In another aspect this invention provides a process for depositing these metals onto a flexible conductive substrate, after which the metals are oxidized to provide perovskite structure.

In another aspect this invention provides a process for depositing these metals onto a circuit or semiconductor on a suitable high temperature substrate.

In another aspect, this invention provides a process for concurrent deposition of these metals using a complexing agent which results in a current density greater than about 15 mA/cm$^2$.

In another aspect, this invention provides a process for concurrent deposition of these metals using a complexing agent which results in a current density greater than about 15 mA/cm$^2$.

In another aspect, this invention provides a means for quickly and easily determining the effectiveness of a candidate complexing agent by means of a cyclic voltammetry test in a defined plating bath which produces a peak current density of at least about 15 mA/cm$^2$.

In another aspect, this invention provides a process for suppressing hydrogen evolution at the cathode of an electroplating bath with the use of a cathodic depolarizer such as a nitrate salt.

Electroplating is an advantageous process for forming superconductive structures in long continuous lengths suitable for winding into coils to obtain powerful magnetic fields. This process is also useful because it can be used to selectively plate onto one or both sides of a flat ribbon. It is also useful in plating onto the surface of a round wire.

Electroplating also enables successive layers of metal to be deposited, and it enables a number of metallic elements to be co-deposited. For example, metals can be deposited in elemental form permitting intimate mixing of the metals as they are deposited. Co-deposited metal elements can interdiffuse to form a uniform composition at relatively low temperatures prior to being oxidized to form ceramic compounds which diffuse more slowly.

Another advantage of the electroplating process of this invention is that the depositing solution can be easily analyzed and adjusted continuously during the process. In this continuous process, a sample of the deposited material can be analyzed (nondestructively by X-ray fluorescence or destructively by partial removal) so that a feedback control circuit can adjust deposition conditions to obtain the desired product.

Yet another advantage of the process of this invention is that multiple layers of different materials can be deposited. Thus, the process enables manufacturing a long, continuous multi-layer superconductor.

Electrodeposits of these elements (yttrium, barium and copper) may be useful as superconductive or as non-superconductive compositions. The non-superconductive compositions can provide barriers between superconductive layers to control magnetic field exclusion effects.

Other advantages of the present invention will be apparent from the following detailed description.

BRIEF DESCRIPTION OF THE DRAWINGS

The invention is described in more detail hereinafter with reference to the accompanying drawings, wherein like reference characters refer to the same parts throughout the several views and in which.

DETAILED DESCRIPTION OF THE INVENTION

The essential characteristic of aqueous electrolyte systems is that one or more of the deposition metal salts be soluble in water at the operating pH and temperature, and that any insoluble deposition component be easily dispersible in the electrolyte. Solubility of all the metal salts is preferably at least 0.1%.

In another aspect the invention provides a process for concurrent electroplating of Y, Ba and Cu from an aqueous electrolyte when certain complexing agents are included.

The complexing agents which have been found to be useful in the process of this invention are those which promote a peak current density of at least about 15 mA/cm$^2$ (more preferably, at least 20 mA/cm$^2$) for barium in a plating bath when subjected to a cyclic voltammetry (CV) test meeting the following parameters:

(a) a molarity of 0.1 for barium;

(b) a molarity of 0.1 for the complexing agent;

(c) a pH of 5.0 or less;

(d) a voltage sweep rate of 50 mV/sec. from 0 to −1200 mV;

(e) ambient temperature (20°–25° C.).

The cyclic voltammetry test (not including the specific plating bath parameters identified above) is described, for example, in Bard & Faulkner, Electrochemical Methods. John Wiley & Sons, New York, 1980, pp. 213–236, incorporated herein by reference.

Figure 6:
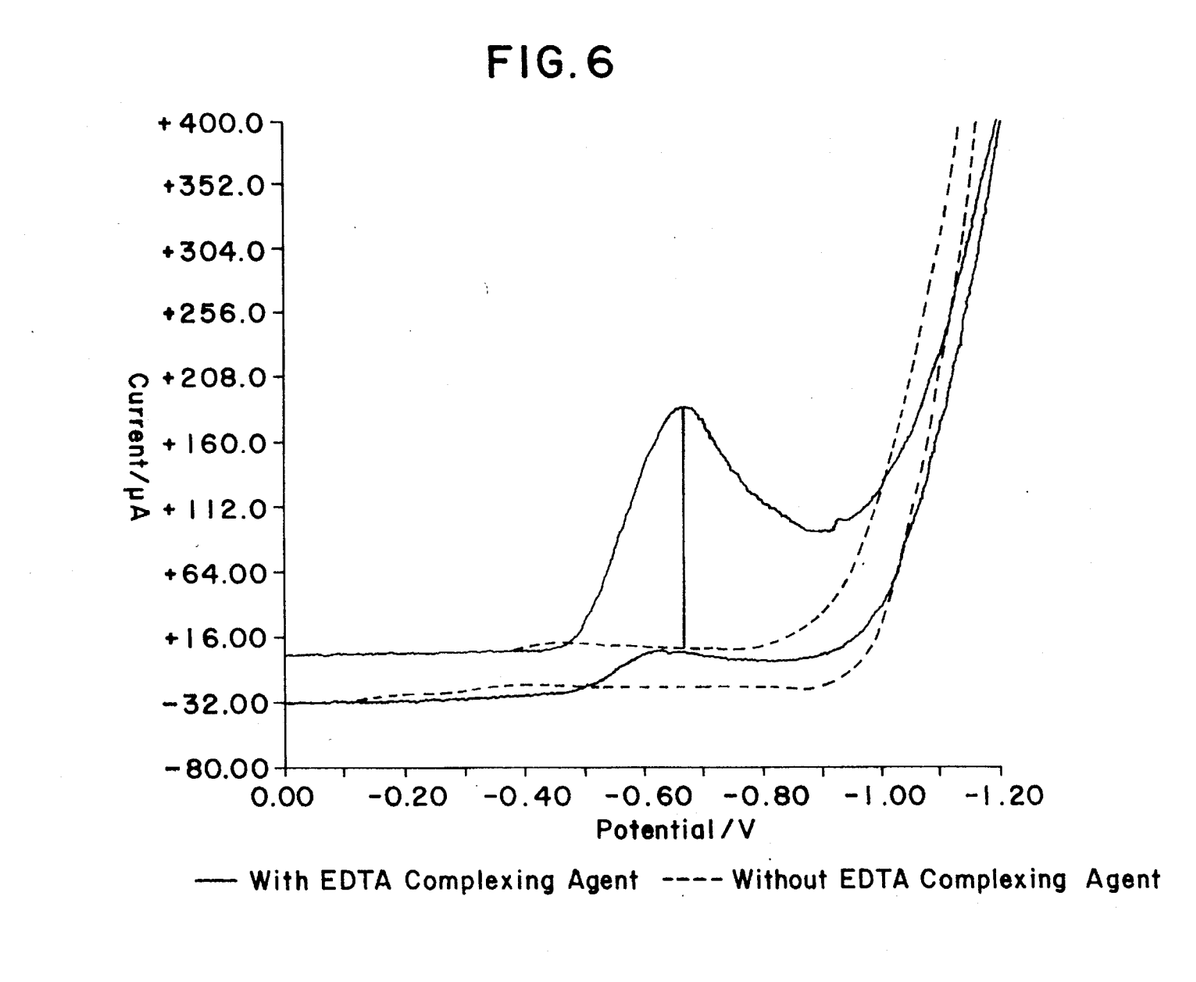
FIG. 6 is an example of the data generated from the cyclic voltammetry experiments. The dotted line curve represents a standard solution containing barium ions and no complexing agent. The solid line curve represents the identical solution as above with the addition of EDTA as a complexing agent in a 0.1 molar concentration. The voltage at which the characteristic cathodic peak or "hump" appears, and the peak current density at this point, defines the effectiveness of the complexing agent.

The peak current density is measured by determining the maximum current in the local "hump" region of the CV curve as illustrated in FIG. 6, subtracting out the background current, and dividing the resultant current by the surface area of the cathode. This data is recorded in Table I for all the complexing agents tested herein.

Figure 5:
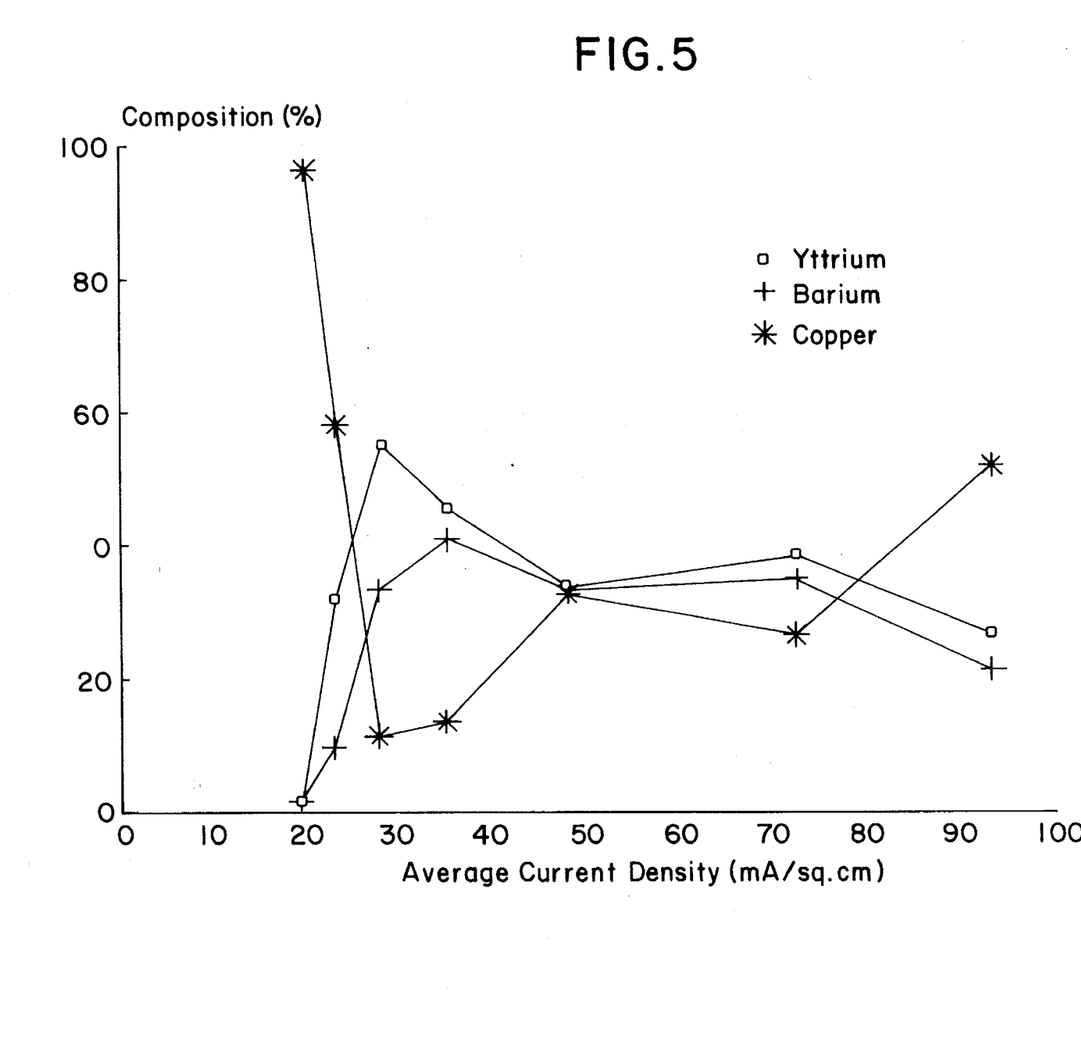
FIG. 5 is a graph illustrating the relationship between current density and film composition for a series of constant potential bulk electrolysis codeposition experiments using EDTA as the complexing agent.

FIG. 5 is a graph showing current density and film composition using an aqueous plating bath having the following composition:

(a) 0.05 molar EDTA complexing agent;

(b) 0.11 molar barium acetate;

(c) 0.07 molar yttrium acetate;

(d) 0.005 molar copper acetate;

(e) 0.07 molar sodium acetate;

(f) 0.05 molar potassium nitrate;

(g) pH of 4.0. The deposition potential used was −3 volts.

Representative examples of useful complexing agents for use in such process include ethylenedinitrilotetraacetic acid (EDTA), the sodium salt thereof, citric acid and citrate salts, picolinic acid, nitrilotriacetic acid, ethylenediamine-N,N-diacetic acid, diethylenetriamine pentacetic acid, triethylenetetraamine hexacetic acid, 1,3-diamino-2-hydroxypropane-N,N,N',N'-tetraacetic acid, 1,3-acetonedicarboxylic acid, N-(2-hydroxyethyl) ethylenediamine triacetic acid, and 2-nitrobenzoic acid.

Complexing agents are sometimes useful in promoting solubility of the metal salts, and they are particularly useful where they promote the reduction of metal ion to elemental metal at a lower potential. See Skoog & West, Fundamentals of Analytical Chemistry, 2nd Edition, Holt, Rinehart & Winston, Inc., 1969, pp. 516–517. The complexing agents defined above perform such function for barium and yttrium in the present invention, changing the reduction potential from −2.91 volts to as much as −0.54 volt for barium and from −2.37 volts to as much as −0.425 volt for yttrium. The concentration of the complexing agent may vary.

The optimum pH for electroplating of metallic elements may vary for different solute/solvent systems, however, the solution must be acidic to be effective (pH of 5 or lower). Neutral or basic solutions cannot prevent the elemental barium electrodeposited onto the cathode from immediately reacting with the water and forming Ba(OH)$_2$.

The electroplating is accomplished using an inert anode (e.g., pure graphite or noble metal) and a metallic or metallized cathode. The electrodes are preferably parallel and a short distance from each other in the electrolyte. Temperature above room ambient conditions may enhance plating rate and deposition quality.

Formation of hydrogen at the cathode during electroplating from acidic solutions can weaken the cathode deposit, causing it to crumble and fall off the electrode. To avoid this and to prevent the potential from becoming so negative that unintended ions are reduced, a cathodic depolarizer, such as a nitrate, is added to the solution. The cathodic depolarizer is more easily reduced than protons and yields a harmless product. See Harris, *Quantitative Chemical Analysis*, W. H. Freeman and Company, San Francisco, 1982, p. 411 and Skoog & West, *Fundamentals of Analytical Chemistry*, 2nd Edition, Holt, Rinehart & Winston, Inc. 1969, p. 511. Various nitrate salts may be used for this purpose, e.g., potassium nitrate, sodium nitrate, or other alkaline metal nitrate salts.

The substrate cathode must be electrically conductive on its surface, and it must be nonreactive with the plating medium under conditions of deposition. For example, it may be metal foil, ribbon, wire or screen, graphite filament or metallized glass filament. The base metal of the substrate may be coated to facilitate electroplating (e.g., silver-plated nickel) or it may be coated with a barrier material to prevent migration of substrate elements into the intended perovskite deposit.

In a continuous process making very long lengths of superconductor, the substrate must be sufficiently flexible to bend over rollers as needed to enter and exit the plating bath, or its profile must be sufficiently smooth to pass through liquid seals.

Perovskite superconductors are known to lose their epitaxial structure when thickness exceeds about 3 microns. Thus, there may be advantages in using multiple layers of 1:2:3 perovskite separated by a non-superconductor (e.g., silver or off-ratio perovskite) to obtain higher total current carrying capacity in thicker layers.

Regardless of thickness, there is an advantage in coating the 1:2:3 perovskite with a normally conductive material such as silver to provide an electrical connection and to provide a moisture barrier for the perovskite.

Figure 1:
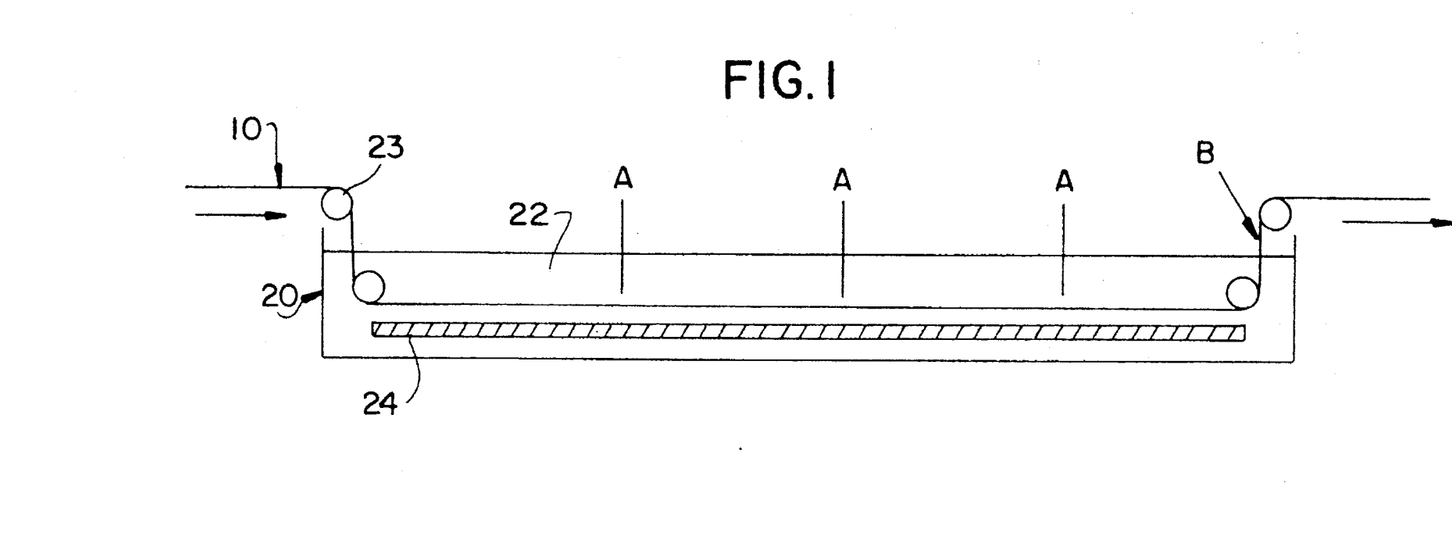
FIG. 1 is a side elevational view illustrating one embodiment of a continuous plating process of this invention.

A continuous production of such a multi-layered superconductor is accomplished with a deposition cell as illustrated in FIG. 1. In these illustrations, a silver ribbon 10 is passed into a long cell 20 containing the barium-yttrium-copper deposition solution 22 and an inert anode 24. The solution is continuously recycled through the deposition cell, chemically analyzed and adjusted to the desired pH and concentration of each ingredient.

A small portion of the product is analyzed at point B or following oxidation of the deposition. Rapid non-destructive chemical analysis is done, for example, by X-ray fluorescence, or a portion of the plating is removed for dissolution and analysis by atomic absorption spectroscopy. This provides a continuous monitor to insure the desired 1:2:3 atomic ratio of yttrium:barium:copper deposit on the silvered ribbon.

In this continuous process, silver ions may be introduced at specific locations A to deposit a silver plate as a restrictive barrier between multiple layers of superconductor.

Alternatively, mixtures of non-superconductive yttrium/barium/copper (e.g., 2/1/1 ratio) can be deposited at separate points A by local changes in solution or deposition conditions.

In FIG. 1 the cathode connection 23 is of negative polarity and is in electrical contact with the substrate ribbon 10 at all times. The anode 24 is of positive polarity. The elongated substrate passes over the various rollers shown in order to enter and pass through the bath.

After the metals have been deposited on the substrate it is necessary to oxidize the metals to obtain the desired perovskite structure having superconductive characteristics at temperatures exceeding 77° K. This is preferably performed by passing the plated substrate through a furnace with controlled oxygen concentration and temperature.

Figure 2:
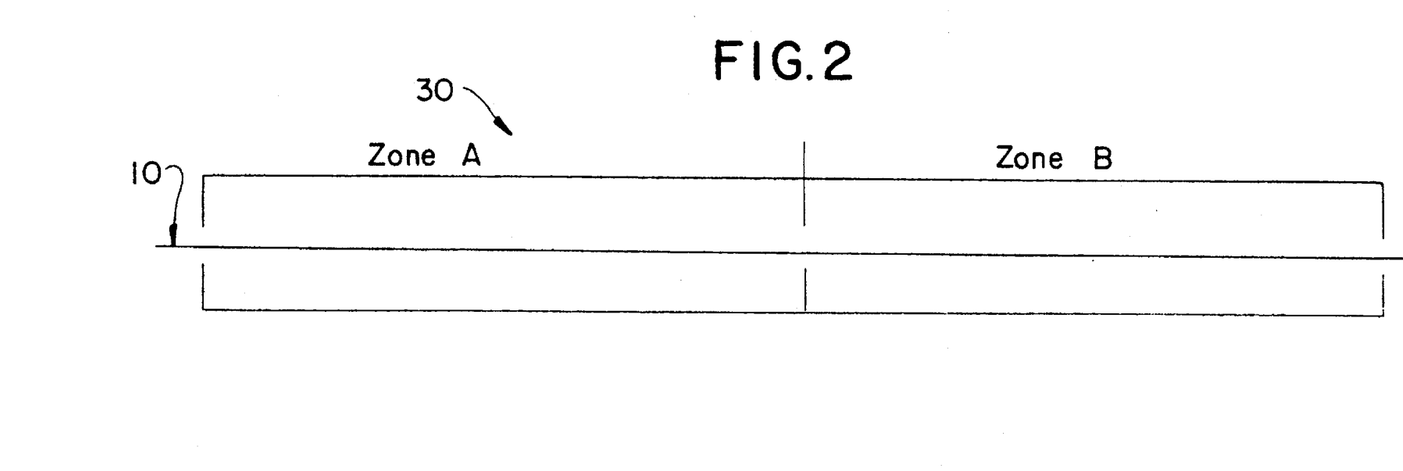
FIG. 2 is a side elevational view illustrating a continuous oxidation process for formation of perovskite superconductor on a substrate.

For example, the continuously plated substrate 10 may be passed through a tube furnace 30 as shown in FIG. 2. The plated ribbon 10 enters the furnace 30 having an atmosphere of oxygen (or nitrogen plus oxygen) where it is oxidized at a temperature in the range of 500° to 1050° C. (zone A) followed by annealing in oxygen in zone B at a temperature in the range of 350°–550° C.

The furnace may be heated externally or the substrate may be inductively heated. Selective heating patterns may be used to promote melt-growth, selective crystal orientation and higher critical current density (ref. P. McGinn, et al., "Microstructure and Critical Current Density of Zone Melt Textured $YBa_2Cu_3O_7$", Appl Physics Letters, vol 57, p. 1455 (1990), incorporated herein by reference). The electrodeposited product of this invention is ideally suited for zone melt texturing because the ribbon or wire can be transported easily and accurately through the zone melting environment.

In the case of a flat ribbon or foil substrate, the plated product may be mechanically worked (e.g., rolled or drawn) prior to or following the oxidation step to increase density, facilitate intermixing, accomplish twinning deformation, and to orient the deposit.

The principles of the invention are illustrated further by means of the following non-limiting examples. In the non-continuous examples an electroplating cell was used comprising (a) a test tube 16 mm in diameter and 250 mm long, (b) a graphite anode 4 mm in diameter and 270 mm long, or a platinum anode 0.5 mm in diameter and 270 mm long, (c) a metallic cathode which in some examples was a constantan ribbon (0.002×0.02 inch) and in other examples was a nichrome ribbon (0.005×0.06 inch) or silver ribbon (0.015× 0.125 inch). The depth of immersion of the anode and cathode in solution was approximately 12 centimeters and the electrode separation was about 0.5 centimeter. The voltage and current were fairly constant during the term of each experiment. The batch experiments were performed at about 23° C. unless noted otherwise.

EXAMPLE 1

In this example the bath contained the following ingredients:

| | |
|---|---|
| Cuprous chloride (hydrated) | 0.021 grams |
| Yttrium chloride | 0.038 grams |
| Barium chloride (oxidated) | 0.49 grams |
| EDTA | 0.10 grams |
| Water | 18 cc |

This solution was electroplated at 2.8 volts onto constantan ribbon with current of 40–68 ma for 3.8 hours. Deposit on the cathode was smooth; and on a 3 cm length it was found to contain:

| | | mol ratio |
|---|---|---|
| Copper | 1.36 milligrams | 4.8 |
| Barium | 1.7 milligrams | 2.8 |
| Yttrium | 0.4 milligrams | 1.0 |

EXAMPLE 2

In this example an aqueous bath was used containing the following ingredients:

| | |
|---|---|
| Copper carbonate | 0.15 molar |
| Yttrium acetate | 0.10 molar |
| Barium oxide suspension | 0.25 molar |
| Citric acid | 0.22 molar |
| Sodium acetate | 0.30 molar |

The pH was adjusted to 3.8 with acetic acid. The cathode was silver-plated constantan.

Electroplating was accomplished at 1.2 volts with current of 180 ma, and duration of 10 minutes. Mol fraction of the smooth deposit on the cathode was as follows:

|  |  | mol ratio |
|---|---|---|
| Copper | 0.55 mols | 3.93 |
| Barium | 0.30 mols | 2.14 |
| Yttrium | 0.14 mols | 1.0 |

This represents a deposit very close to the desired 1:2:3 or 1:2:4 ratio of the metals.

EXAMPLE 3

This example used the same bath solution as in Example 2. The cathode was silver-plated constantan. At 2.1 volts and 85 ma, the plating bath in 10 minutes gave mol fractions as follows:

|  |  | mol ratio |
|---|---|---|
| Copper | 0.51 mols | 2.22 |
| Barium | 0.26 mols | 1.13 |
| Yttrium | 0.23 mols | 1.0 |

EXAMPLE 4

In this example an aqueous bath was used containing the following ingredients:

| Copper carbonate | 0.014 molar |
|---|---|
| Yttrium acetate | 0.21 molar |
| Barium oxide suspension | 0.33 molar |
| Sodium acetate | 0.40 molar |
| Citric acid | 0.20 molar |

The solution had a pH of 4.0, and the cathode was silver-plated nichrome.

Electroplating took place for 20 minutes at 4.1 volts, 500 ma, and gave a smooth deposit with analysis showing the following mol fractions:

|  |  | mol ratio |
|---|---|---|
| Copper | 0.50 mols | 2.94 |
| Barium | 0.33 mols | 1.94 |
| Yttrium | 0.17 mols | 1.0 |

This deposition gave almost the ideal 1:2:3 mol ratio for the key metals.

EXAMPLE 5

In this example an aqueous bath was used containing the following ingredients:

| Cupric chloride | 0.3 molar |
|---|---|
| Barium chloride suspension | 0.2 molar |
| Yttrium chloride | 0.1 molar |
| Citric acid | 0.22 molar |
| Sodium EDTA | 0.0025 molar |

The pH was 3.0 and the cathode was silver-plated nichrome.

Electroplating at 3.5 volts, 190 ma, for 120 minutes gave a smooth coating with mol fractions as follows:

|  |  | mol ratio |
|---|---|---|
| Copper | 0.51 mols | 3.64 |
| Barium | 0.35 mols | 2.5 |
| Yttrium | 0.14 mols | 1.0 |

EXAMPLE 6

This example used a clear solution containing the following ingredients:

| Yttrium acetate | 0.33 molar |
|---|---|
| Barium acetate | 0.47 molar |
| Copper acetate | 0.01 molar |
| Sodium EDTA | 0.001 molar |
| Sodium citrate | 0.03 molar |

The pH was adjusted to 4.8 with ammonium hydroxide; the cathode was silver-plated nickel wire.

In 30 minutes of plating at 4.5 volts, the deposit was found to contain:

|  |  | mol ratio |
|---|---|---|
| Copper | 0.44 mols | 2.2 |
| Barium | 0.36 | 1.8 |
| Yttrium | 0.20 | 2.0 |

EXAMPLE 7

An aqueous bath was used containing the following ingredients:

| Yttrium acetate | 0.21 molar |
|---|---|
| Barium oxide suspension | 0.33 molar |
| Cupric carbonate | 0.014 molar |
| Citric acid | 0.2 molar |
| Sodium acetate | 0.4 molar |

The pH was 4.0, and the cathode was silver ribbon.

In 30 minutes of plating at 4.0 volts, the deposit was found to contain:

|  |  | mol ratio |
|---|---|---|
| Copper | 0.49 mol | 3.06 |
| Barium | 0.35 mol | 2.19 |
| Yttrium | 0.16 mol | 1.0 |

This was very close to the ideal 1:2:3 mol ratio.

EXAMPLE 8

The clear aqueous bath contained the following ingredients:

| Yttrium acetate | 0.33 molar |
|---|---|
| Barium acetate | 0.39 molar |
| Copper acetate | 0.005 molar |

-continued

| | |
|---|---|
| Sodium citrate | 0.03 molar |
| Sodium EDTA | 0.004 molar |

The pH was 4.05, and the cathode was silver ribbon. The anode was platinum.

With electroplating 4.5 volts, 400 ma, and current density 31 ma/sq cm, the cathode deposit was found to contain:

| | | mol ratio |
|---|---|---|
| Copper | 0.58 mols | 3.87 |
| Barium | 0.27 mols | 1.8 |
| Yttrium | 0.15 mols | 1.0 |

This composition was noted to be very close to the known superconductive 1:2:4 composition.

The ribbon was then oxidized in an oxygen atmosphere under the following conditions:

| | |
|---|---|
| Room temperature to 950° C. | 3 hours |
| 950° C. | 15 minutes |
| 950 to 660° C. | 30 minutes |
| 660° C. | 3 hours |
| 660 to 450° C. | 30 minutes |
| 450° C. | 22 hours | then cooled to room temperature

Figure 3:
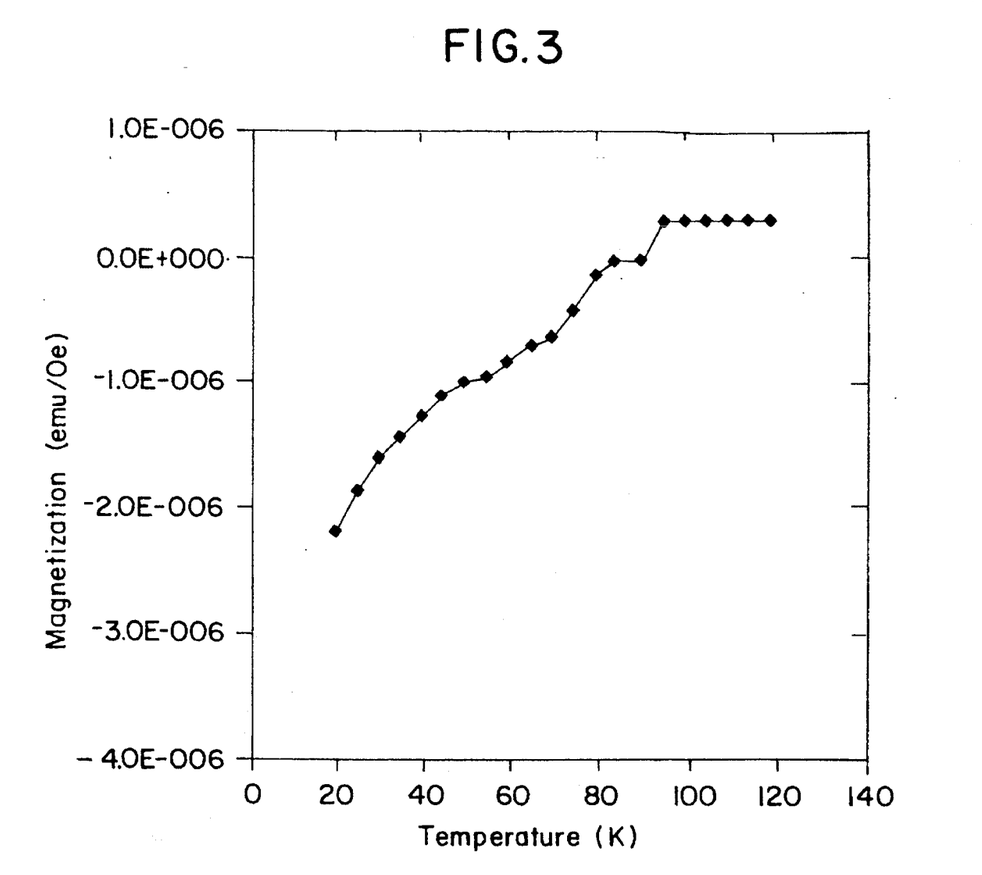
FIG. 3 is a graph illustrating superconductive characteristics of a composition deposited in accordance with the techniques of this invention.

A section of this ribbon (after oxidation) was tested for superconductive characteristics using a Squid magnetometer. It was confirmed to be superconductive at 85° K. as shown in FIG. 3.

EXAMPLE 9

A clear aqueous solution was used containing the following ingredients:

| | |
|---|---|
| Yttrium acetate | 0.33 molar |
| Barium acetate | 0.47 molar |
| Copper acetate | 0.010 molar |
| Sodium citrate | 0.03 molar |
| Sodium EDTA | 0.004 molar |

Solution pH was 4.0, the anode was platinum, and the cathode was silver ribbon.

In 45 minutes of electroplating at 4.8 volts, 600 ma, 49 ma/sq cm, the deposit on the cathode was found to contain:

| | | mol ratio |
|---|---|---|
| Copper | 0.52 mol | 2.36 |
| Barium | 0.26 mol | 1.18 |
| Yttrium | 0.22 mol | 1.0 |

The ribbon was oxidized with the following conditions:

| | |
|---|---|
| Room temperature to 950° C. | 98 minutes, dry oxygen |
| 950° C. to 500° C. | 52 minutes, wet oxygen |
| 500° C. | 60 hours, dry oxygen |
| 500*C to room temperature | 3 hours, dry oxygen |

The ribbon was tested with a Squid magnetometer and showed evidence of superconductivity at 85° K. similar to that of Example 8.

EXAMPLE 10

A continuous electroplating system was set up whereby a silver ribbon was plated from the following solution:

| | |
|---|---|
| Copper acetate | 0.012 molar |
| Barium acetate | 0.44 molar |
| Yttrium acetate | 0.34 molar |
| Sodium citrate | 0.03 molar |
| Sodium EDTA | 0.04 molar |

Solution pH was adjusted to 4.5 with acetic acid. Plating took place at 45° C. with 4.4 volts and 530–560 ma current on approximately 7.5 sq cm of ribbon traveling through the bath at 5 cm/minute.

The ribbon was promptly passed through a furnace at 710°–720° C. through a gaseous atmosphere of NF grade nitrogen containing a small amount of oxygen. The ribbon was subsequently heated in an oxygen environment to 920° C. about 2 hours, then at 550° C. for 20 hours.

Figure 4:
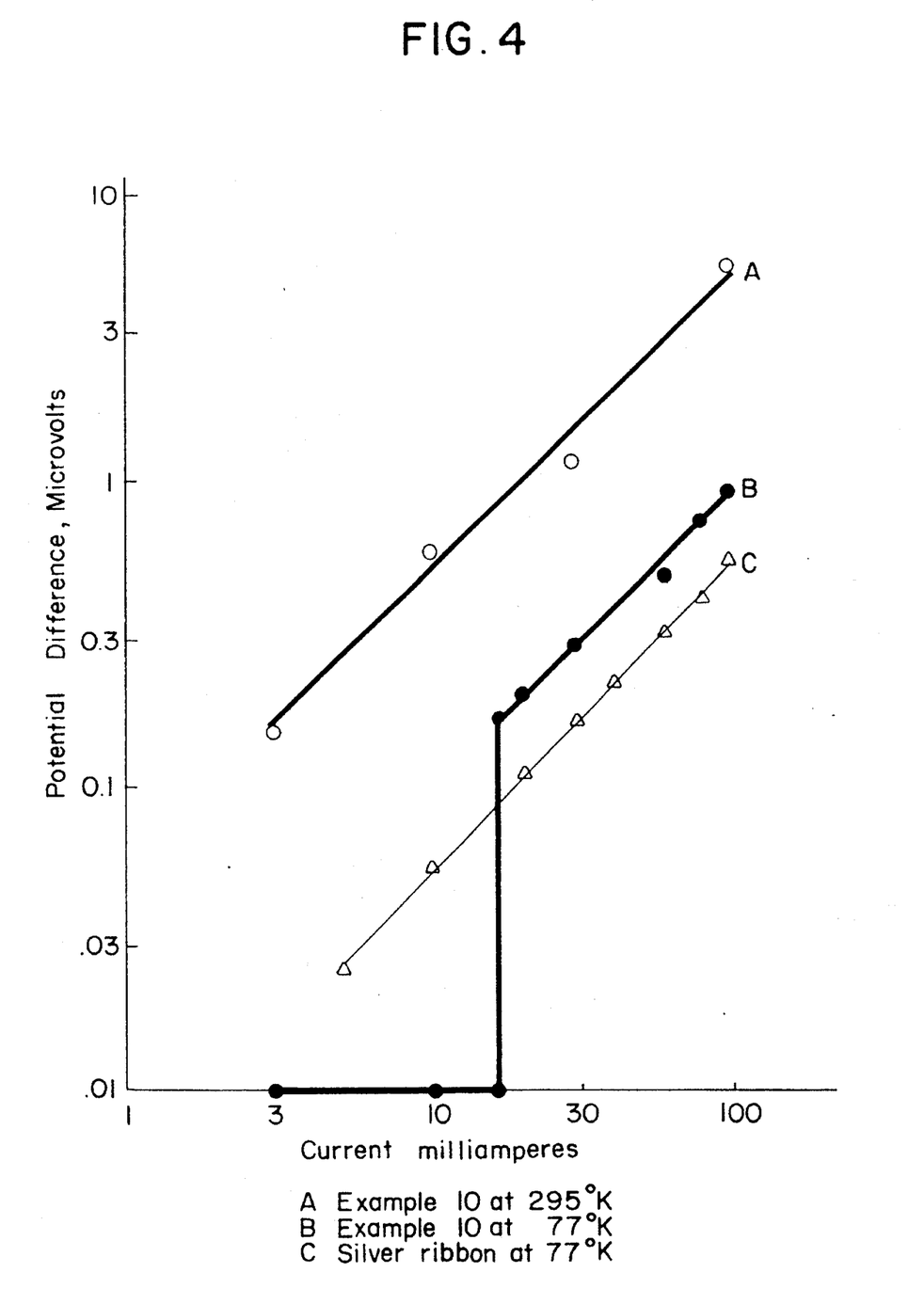
FIG. 4 is a graph showing the voltage/current relationships for a ribbon produced in a continuous process in accordance with techniques of this invention.

The ribbon was confirmed as being superconductive at 77° K. using conventional 4-point resistance measuring system with a range of currents. Curve B of FIG. 4 shows that the critical current density of this ribbon at 77° K. was about 1000 amperes/sq cm (based on the area of deposit as estimated from AA analysis of the deposited metals). This occurred at the abrupt change of voltage between the lower limit of measurement (0.01 microvolt) and an ohmic resistance with constant slope of voltage vs. current. FIG. 4 also shows the ohmic resistance of this ribbon at room temperature and the ohmic resistance of an unplated silver ribbon in liquid nitrogen.

EXAMPLES 11–49

Several potential complexing agents were tested in a plating bath to determine their effectiveness in plating barium and yttrium. The concentration of the metal ion and the complexing agent in each example was 0.1 molar, except that in Examples 32 and 34 the concentration was 0.04 molar for each, and in Example 33 the concentration was 0.1 molar yttrium and 0.05 molar complexing agent. The complexing agents and the cyclic voltammetry data are shown in Table I.

EXAMPLES 50–65

The complexing agents referred to in Examples 11–49 were tested in connection with co-deposition experiments. The results are shown in Table II.

Other variants are possible without departing from the scope of this invention.

TABLE 1

Cyclic Voltammetry

| Exp. # | Complexing agent | Metal | pH | Peak: (mV) | Peak: (µA) | Peak Current Density (mA/cm$^2$) |
|---|---|---|---|---|---|---|
| 11 | 18-Crown-6 | BaCl$_2$ | 4.5 | −465 | 8.6 | 1.1 |
| 12 | Picolinic acid* | BaCl$_2$ | 3.5 | −657 | 310 | 39.5 |
| 13 | Picolinic acid | YCl$_3$ | 3.0 | −506 | 132 | 16.8 |
| 14 | Oxalic acid | BaCl$_2$ | 3.4 | −439 | 41 | 5.2 |
| 15 | Ethylenediamine | BaCl$_2$ | 3.0 | ** | ** | ** |
| 16 | Triethanol amine | BaO | 2.0 | −561 | 53 | 6.7 |
| 17 | 1,10-Phenathroline* | BaCl$_2$ | 4.5 | −647 | 142 | 18.1 |
| 18 | 1,10-Phenathroline | YCl$_3$ | 4.3 | −672 | 153 | 19.5 |
| 19 | 2,2'-Bipyridine | BaCl$_2$ | 4.5 | −596 | 64 | 8.1 |
| 20 | 2,2'-Bipyridine | YCl$_3$ | 4.6 | −591 | 55 | 7.0 |
| 21 | Glycine | BaO | 3.0 | −615 | 101 | 12.8 |
| 22 | Glycine | YCl$_3$ | 4.0 | −470 | 33 | 4.2 |
| 23 | Proline | BaO | 2.0 | ** | ** | ** |
| 24 | Nitrilotriacetic acid* | BaCl$_2$ | 4.0 | −895 | 190 | 24.2 |
| 25 | Nitrilotriacetic acid | YCl$_3$ | 3.9 | −444 | 43 | 5.5 |
| 26 | Ethylenediamine tetraacetic acid* | BaCl$_2$ | 4.0 | −652 | 230 | 29.3 |
| 27 | Ethylenediamine tetraacetic acid | YCl$_3$ | 4.2 | −425 | 220 | 28.0 |
| 28 | Ethylenediamine-N,N'-diacetic acid* | BaCl$_2$ | 4.5 | −734 | 272 | 34.6 |
| 29 | Ethylenediamine-N,N'-diacetic acid | YCl$_3$ | 4.8 | −719 | 286 | 36.4 |
| 30 | Diethylenetriamine pentaacetic acid* | BaCl$_2$ | 4.7 | −572 | 170 | 21.6 |
| 31 | Diethylenetriamine pentaacetic acid | YCl$_3$ | 4.0 | −463 | 22 | 2.8 |
| 32# | Triethylenetetramine hexaacetic acid* | BaCl$_2$ | 4.8 | −700 | 153 | 19.5 |
| 33# | Triethylenetetramine hexaacetic acid | YCl$_3$ | 4.6 | −540 | 16 | 2.0 |
| 34# | 1,6-Diaminohexane-N,N,N',N'-tetraacetic acid | BaCl$_2$ | 4.2 | −460 | 31 | 3.9 |
| 35 | 1,3-Diamino-2-hydroxypropane-N,N,N',N'-tetraacetic acid* | BaCl$_2$ | 4.7 | −917 | 212 | 27.0 |
| 36 | 1,3-Diaminio-2-hydroxypropane-N,N,N',N'-tetraacetic acid | YCl$_3$ | 4.0 | −501 | 116 | 14.8 |
| 37 | 1,3-Acetonedicarboxylic acid* | BaCl$_2$ | 4.1 | −549 | 182 | 23.2 |
| 38 | 1,3-Acetonedicarboxylic acid | YCl$_3$ | 3.0 | −527 | 166 | 21.1 |
| 39 | N-(2-Hydroxyethyl)ethylenediamine triacetic acid* | BaCl$_2$ | 4.7 | −716 | 291 | 37.1 |
| 40 | N-(2-Hydroxyethyl)ethylenediamine triacetic acid | YCl$_3$ | 4.5 | −527 | 33 | 4.2 |
| 41 | Citric acid* | BaCl$_2$ | 4.0 | −539 | 214 | 27.2 |
| 42 | Citric acid | YCl$_3$ | 3.0 | −473 | 181 | 23.0 |
| 43 | Tartaric acid* | BaCl$_2$ | 3.8 | −554 | 175 | 22.3 |
| 44 | Tartaric acid | YCl$_3$ | 3.0 | −516 | 71 | 9.0 |
| 45 | 2-Nitrobenzoic acid* | BaCl$_2$ | 4.0 | −895 | 709 | 90.3 |
| 46 | 2-Nitrobenzoic acid | YCl$_3$ | 4.3 | −735 | 173 | 22.0 |
| 47 | Barium Acetylacetonate | | 4.0 | −567 | 64 | 8.1 |
| 48 | Catechol | BaCl$_2$ | 3.4 | −423 | 28 | 3.6 |
| 49 | Sucrose | BaCl$_2$ | 4.0 | −439 | 17 | 2.2 |

All concentration are .1M except for 32b & 34 which are .04M Barium chloride and .04M complexing agent, and 33 which is .1M Yttrium chloride and .05M complexing agent
**hump was similar with and without metal, indicating that it was due to complexing agent and not metal being plated

*Indicates the complexing agent produces currents in excess of 15 mA/cm$^2$ for barium.

TABLE II

Codepositon Experiment

| | | Trial 1 | | Trial 2 | |
|---|---|---|---|---|---|
| EXP. # | Complexing agent | pH | At. %[1] Y,Ba,Cu | pH | At. %[1] Y,Ba,Cu |
| 50 | none | | | 4.5 | 2.59 / 3.46 / 93.95 |
| 51 | Picolinic acid | 4.0 | 0.69 / 0.73 / 98.58 | 4.5 | 7.08 / 10.40 / 82.52 |
| 52 | 1,10-Phenathroline | 4.5 | 53.48 / 33.13 / 13.39[2] | | |
| 53 | 2,2'-Bipyridine | | | 4.5 | none[2] |
| 54 | Glycine | | | 4.5 | 1.72 / 1.65 / 96.62 |
| 55 | Nitrilotriacetic acid | 3.5 | 3.04 | 3.5 | 15.62 / 3.29 / 93.66 |
| 56 | Ethylenediamine tetraacetic acid | 4.0 | 4.16 / 2.53 / 93.32 | 4.0 | 11.28 / 73.09 / 39.93 / 44.99 / 15.08 |
| 57 | Ethylenediamine-N,N'-diacetic acid | 4.0 | 1.34 / 2.96 / 95.70 | 4.5 | 14.66 / 6.90 / 78.44 |
| 58 | Diethylenetriamine pentaacetic acid | 4.0 | 1.32 / 0.55 / 98.13 | 4.5 | 34.26 / 20.29 / 45.45 |
| 59 | 1,3-Diamino-2-hydroxy-propane-N,N,N',N'-tetraacetic acid | 4.0 | 4.12 / 3.22 / 92.66 | 4.5 | 31.58 / 34.97 / 33.45 |

TABLE II-continued

Codepositon Experiment

| EXP. # | Complexing agent | Trial 1 pH | Trial 1 At. %[1] Y,Ba,Cu | Trial 2 pH | Trial 2 At. %[1] Y,Ba,Cu |
|---|---|---|---|---|---|
| 60 | 1,3-Acetonedicarboxylic acid | 4.2 | 10.34<br>4.63<br>85.03 | 4.6 | 39.94<br>33.34<br>26.72 |
| 61 | N-(2-Hydroxyethyl) ethylenediamine triacetic acid | | | 4.5 | 30.94<br>26.15<br>42.90 |
| 62 | 2-Carboxyphenylamino-diacetic acid | | | 4.5 | 2.88<br>4.65<br>92.47 |
| 63 | Citric acid | 3.0 | 36.13<br>41.58<br>22.29 | | |
| 64 | Tartaric acid | 1.5 | 5.60<br>2.38<br>92.02 | 1.5 | 5.56<br>4.03 |
| 65 | 2-Nitrobenzoic acid | | | 4.5 | 14.258<br>13.37<br>72.38 |

[1]Target ratio for superconductivity is 16.67% Yttrium, 33.33% Barium, and 50.00% Copper.
[2]Actual deposition was extremely low. Analysis shows mainly silver with traces of Y, Ba, Cu in the ratios given.

On trial #1, all solutions were:

0.15M Barium chloride hydrate 0.08M Yttrium acetate 0.0075M Copper acetate hydrate 0.05M Potassium nitrate 0.1M complexing agent with the following exceptions:

Exp. #57 0.05M Ethylenediamine-N,N-diacetic acid2

Exp. #63 0.1M Citric acid 0.15M Barium chloride hydrate 0.1M Yttrium acetate 0.01M Copper acetate hydrate 0.05M Potassium nitrate 2 cm² surface area for all experiments On trial #2, all solutions were:

0.11M Barium acetate hydrate 0.07M Yttrium acetate 0.005M Copper acetate hydrate 0.07M Sodium acetate 0.05M Potassium nitrate 0.05M complexing agent with the following exceptions:

Exp. #65 0.1M Nitrilotriacetic acid

Exp. #58 0.1M 1,3-Acetonedicarboxylic acid 1 cm² surface area for all experiments All experiments were constant potential Bulk Electrolsis on 97%+silver ribbon at −3000 mV with a Saturated Calomel Electrode (SCE) reference

What is claimed is:

1. A process for concurrent electroplating of yttrium, barium and copper elements from aqueous solution onto an electrically conductive substrate comprising the steps of:

(a) dissolving compounds of said elements in water containing complexing agent and adjusted to a pH of 5 or less, said complexing agent is selected from the group consisting of picolinic acid, ethylenediamine-N,N'-diacetic acid, diethylenetriamine pentaacetic acid, 1,3-diamino-2-hydroxypropane-N,N,N',N'-tetraacetic acid, nitrilotriacetic acid, triethylenetetra-amine hexaacetic acid, N-(2-hydroxyethyl)ethylenediamine triacetic acid, 1,3-acetonedicarboxylic acid, 2-nitrobenzoic acid, or a salt thereof;

(b) inserting an anode and a cathode into said solution; wherein said cathode comprises said substrate; and (c) creating an electrical potential on said cathode at −0.5 volts or less with a current density of at least about 15 mA/cm² to cause electrodeposition of said elements onto said cathode.

2. A process in accordance with claim 1, wherein said complexing agent comprises picolinic acid or a salt thereof.

3. A process in accordance with claim 1, wherein said complexing agent comprises ethylenediamine-N,N'-diacetic acid or a salt thereof.

4. A process in accordance with claim 1, wherein said complexing agent comprises diethylenetriamine pentaacetic acid or a salt thereof.

5. A process in accordance with claim 1, wherein said complexing agent comprises 1,3-diamino-2-hydroxypropane-N,N,N',N'-tetraacetic acid or a salt thereof.

6. A process in accordance with claim 1, wherein said complexing agent comprises nitrilotriacetic acid or a salt thereof.

7. A process in accordance with claim 1, wherein said complexing agent comprises triethylenetetraamine hexaacetic acid or a salt thereof.

8. A process in accordance with claim 1, wherein said complexing agent comprises N-(2-hydroxyethyl)ethylenediamine triacetic acid or a salt thereof.

9. A process in accordance with claim 1, wherein said complexing agent comprises 1,3-acetonedicarboxylic acid or a salt thereof.

10. A process in accordance with claim 1, wherein said complexing agent comprises 2-nitrobenzoic acid or a salt thereof.

11. A process in accordance with claim 1, wherein said current density is at least about 20 mA/cm².

12. A process in accordance with claim 1, wherein the molar ratio of yttrium, barium and copper deposited on said cathode is essentially 1:2:3.

13. A process in accordance with claim 1, wherein the molar ratio of yttrium, barium and copper deposited on said cathode is essentially 1:2:4.

14. A process in accordance with claim 1, wherein said compounds of yttrium and copper are selected from the group consisting of acetate salts, chloride salts and nitrate salts, and said compound of barium is selected from the group consisting of oxides, chloride salts and acetates.

15. A process in accordance with claim 1, wherein said substrate comprises a flexible metallic ribbon.

16. A process in accordance with claim 15, wherein said metallic ribbon is selected from the group consisting of nickel alloys, silver alloys, and platinum alloys.

17. A process in accordance with claim 12, further comprising the step of oxidizing said elements on said substrate to form $YBa_2Cu_3O_7$ perovskite structure.

18. A process in accordance with claim 13, further comprising the step of oxidizing said elements on said substrate to form $YBa_2Cu_4O_8$.

19. A process in accordance with claim 1, further comprising depositing a layer of non-superconductor material over said perovskite structure, after which a layer of said perovskite is deposited on said non-superconductor material.

20. A process for continuous production of superconductive ribbon comprising the steps of:

(a) electroplating yttrium, barium and copper elements on a moving metallic ribbon
  (i) dissolving compounds of said elements in water containing a complexing agent and adjusted to a pH of 5 or less, said complexing agent is selected from the group consisting of picolinic acid, ethylenediamine-N,N'-diacetic acid, diethylenetriamine pentaacetic acid, 1,3-diamino-2-hydroxypropane-N,N,N',N'-tetraacetic acid, nitrilotriacetic acid, triethylenetetra-amine hexaacetic acid, N-(2-hydroxyethyl)ethylenediamine triacetic acid, 1,3-acetonedicarboxylic acid, 2-nitrobenzoic acid, or a salt thereof;
  (ii) inserting an anode and a cathode into said solution; wherein said cathode comprises said substrate; and
  (iii) creating an electrical potential on said cathode at $-0.5$ volts or less with a current density of at least about 15 $mA/cm^2$ to cause electrodeposition of said elements onto said cathode and then,
(b) oxidizing said elements by passing said ribbon through a furnace including an atmosphere containing oxygen.

21. A continuous process in accordance with claim 20 further including sampling, analysis and feedback to control electrodeposition conditions for multi-component plating systems, whereby a small amount of the electrodeposit is removed from the plating article, chemically analyzed promptly to ascertain amount of each component, and controlling the composition of said solution or the amount of said electrical potential.

22. A continuous process in accordance with claim 20 further including sampling, analysis and feedback to control electrodeposition conditions for multi-component plating systems, whereby the electrodeposit is nondestructively analyzed to ascertain the amount of each deposited component, and controlling the composition of said solution or the amount of said electrical potential.

23. A process in accordance with claim 1, further comprising the step of forming multiple electrodeposits of superconductive perovskite precursors which are separated by electrodeposits of precursors to non-superconductive perovskite.

24. A process in accordance with claim 23, wherein said multiple electrodeposits of superconductive perovskite precursors are separated by electrodeposits of inert metal selected from the group consisting of silver, gold and platinum.

* * * * *